(12) United States Patent
Shih et al.

(10) Patent No.: US 6,974,505 B2
(45) Date of Patent: Dec. 13, 2005

(54) TOOL FOR CLEANING SUBSTRATES

(75) Inventors: Hsin-Ching Shih, Chang-hua (TW);
Chun-Li Chou, Shinjuang (TW);
Ming-Hong Hsieh, Pa-Teh (TW);
Hong-J. Tao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 145 days.

(21) Appl. No.: 10/272,623

(22) Filed: Oct. 16, 2002

(65) Prior Publication Data
US 2004/0074521 A1    Apr. 22, 2004

(51) Int. Cl.[7] .................................................. B08B 7/04

(52) U.S. Cl. ........................ 134/37; 134/34; 134/109; 134/111; 134/108; 134/184; 134/195; 134/902; 34/364; 34/576

(58) Field of Search ............................ 134/34, 37, 184, 134/195, 198, 200, 108, 109, 111, 902; 34/364, 34/576

(56) References Cited

U.S. PATENT DOCUMENTS 5,009,240 A  *  4/1991  Levi ................................. 134/7
5,948,173 A  *  9/1999  Huh et al. ...................... 134/34

* cited by examiner

Primary Examiner—M. Kornakov
(74) Attorney, Agent, or Firm—Tung & Associates

(57) ABSTRACT

A cleaning tool for cleaning substrates, comprising a circulation conduit through which is circulated a cleaning liquid or gas. The circulation conduit is disposed in fluid communication with an upstream flow chamber and a downstream cleaning chamber, the cross-sectional area of which cleaning chamber is less than the cross-sectional area of the flow chamber. In use, the cleaning chamber receives a wafer substrate for cleaning of particles or removal of polymer films from the substrate. The smaller cross-sectional area of the cleaning chamber accelerates the flow of a cleaning fluid flowing through the cleaning chamber from the flow chamber. The rapidly-flowing cleaning fluid removes the particles and/or films from the substrate while preventing dropping of the removed particles or re-deposition of the film back onto the substrate. A particle filter may be provided in the circulation conduit downstream of the cleaning chamber for removing the particles.

14 Claims, 1 Drawing Sheet

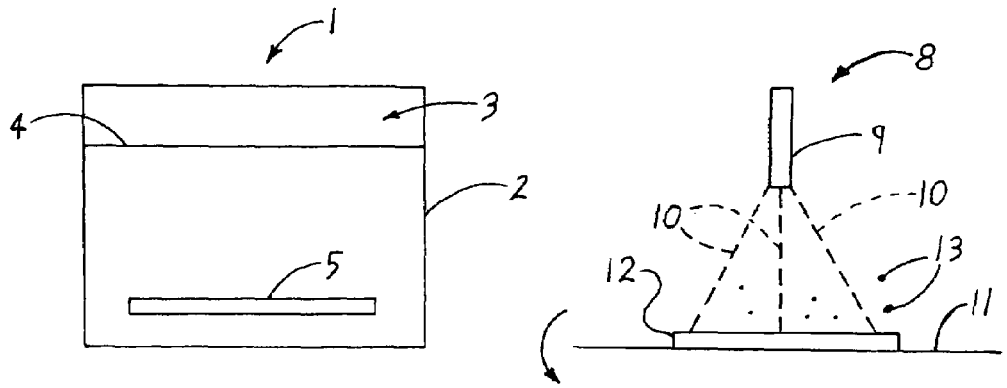
FIG. 1
*Prior Art*
FIG. 2
*Prior Art*
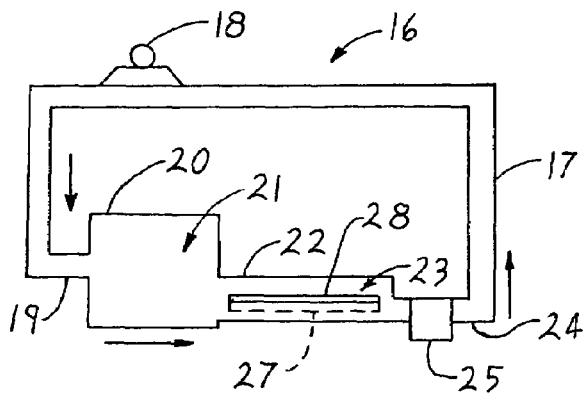
FIG. 3
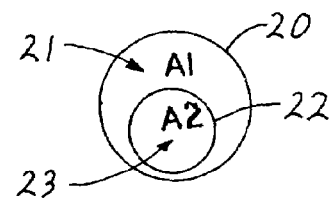
FIG. 5
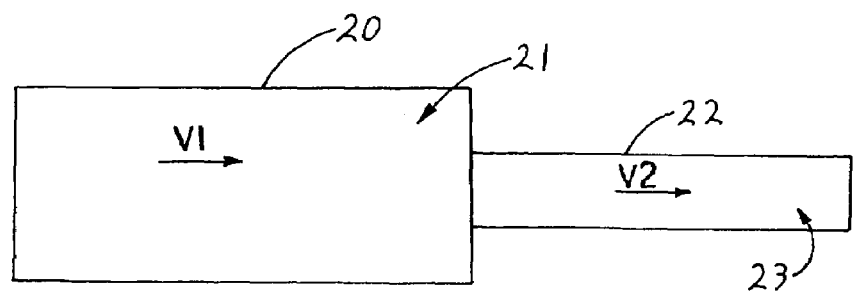
FIG. 4

TOOL FOR CLEANING SUBSTRATES

FIELD OF THE INVENTION

The present invention relates to processes and equipment for removing organic films and potential circuit-contaminating particles from WIP (work-in-process) semiconductor wafers in the semiconductor fabrication industry. More particularly, the present invention relates to a new and improved design for a cleaning tool which prevents redeposition of polymer films and particles on the substrates during the cleaning process.

BACKGROUND OF THE INVENTION

Generally, the process for manufacturing integrated circuits on a silicon wafer substrate typically involves deposition of a thin dielectric or conductive film on the wafer using oxidation or any of a variety of chemical vapor deposition processes; formation of a circuit pattern on a layer of photoresist material by photolithography; placing a photoresist mask layer corresponding to the circuit pattern on the wafer; etching of the circuit pattern in the conductive layer on the wafer; and stripping of the photoresist mask layer from the wafer. Each of these steps, particularly the photoresist stripping step, provides abundant opportunity for organic, metal and other potential circuit-contaminating particles to accumulate on the wafer surface.

In the semiconductor fabrication industry, minimization of particle contamination on semiconductor wafers increases in importance as the integrated circuit devices on the wafers decrease in size. With the reduced size of the devices, a contaminant having a particular size occupies a relatively larger percentage of the available space for circuit elements on the wafer as compared to wafers containing the larger devices of the past. Moreover, the presence of particles in the integrated circuits compromises the functional integrity of the devices in the finished electronic product. Currently, mini-environment based IC manufacturing facilities are equipped to control airborne particles much smaller than 1.0 $\mu$m, as surface contamination continues to be of high priority to semiconductor manufacturers. To achieve an ultraclean wafer surface, particles must be removed from the wafer, and particle-removing methods are therefore of utmost importance in the fabrication of semiconductors.

The most common system for cleaning semiconductor wafers during wafer processing includes a series of tanks which contain the necessary cleaning solutions and are positioned in a "wet bench" in a clean room. Batches of wafers are moved in sequence through the tanks, typically by operation of a computer-controlled automated apparatus. Currently, semiconductor manufacturers use wet cleaning processes which may use cleaning agents such as deionized water and/or surfactants. Other wafer-cleaning processes utilize solvents, dry cleaning using high-velocity gas jets, and a megasonic cleaning process, in which very high-frequency sound waves are used to dislodge particles from the wafer surface. Cleaning systems which use deionized (DI) water currently are widely used in the industry because the systems are effective in removing particles from the wafers and are relatively cost-efficient. Approximately 4.5 tons of water are used for the production of each 200-mm, 16-Mbit, DRAM wafer.

FIG. 2 illustrates a typical conventional spin-type cleaning tool 8, which includes a spray nozzle 9 positioned above a rotatable substrate support 11. As a wafer substrate 12 is rotated on the substrate support 11, the spray nozzle 9 sprays cleaning liquid streams 10 at high pressure against the surface of the substrate 12 to remove particles 13 from the substrate 12. While most of the particles 13 are effectively removed from the substrate 12 by the high-pressure cleaning liquid streams 10, some of the particles 13 are temporarily ejected from the surface of the substrate 12 and fall back onto the substrate 12. If these particles remain on the substrate 12 after the cleaning process, the particles 13 may contaminate devices fabricated on the substrate 12.

A typical conventional batch-type, or wet bench, cleaning tool for wafers is generally indicated by reference numeral 1 in FIG. 1, and includes a cleaning chamber 2 defining a chamber interior 3. A wafer substrate 5 is submerged in a suitable cleaning fluid 4 in the chamber interior 3, such that the cleaning fluid 4 dissolves and removes organic film, such as photoresist, from the surface of the substrate 5. Unlike the spin-type cleaning tool 8, the conventional batch-type cleaning tool 1 is effective in preventing re-deposition of removed particles back onto the substrate 5. However, one of the problems frequently encountered in use of the conventional batch-type cleaning tool 1 is that the organic photoresist material, initially dissolved in the cleaning fluid 4, tends to become re-deposited on the surface of the substrate 5 upon removal of the substrate 5 from the cleaning chamber 2. This adversely affects the yield of devices on the substrate 5. Accordingly, a cleaning tool is needed for both thoroughly cleaning organic films and potential device-contaminating particles from substrates and preventing re-deposition of the films and particles on the substrates during the cleaning process.

An object of the present invention is to provide a new and improved tool for cleaning substrates.

Another object of the present invention is to provide a new and improved tool which is effective in removing potential device-contaminating particles from substrates and preventing the particles from falling back onto the substrates during a substrate-cleaning process.

Still another object of the present invention is to provide a new and improved tool which is effective in removing polymer films from substrates while preventing re-deposition of the films on the substrates during a substrate-cleaning process.

Yet another object of the present invention is to provide a new and improved tool which is effective in thoroughly cleaning potential device-contaminating particles and polymer films from substrates and preventing re-deposition of the particles or films on the substrates during a substrate-cleaning process.

A still further object of the present invention is to provide a new and improved method of effectively cleaning particles and removing polymer films from substrates and preventing substrate re-contamination and film deposition on the substrates.

Yet another object of the present invention is to provide a new and improved tool and method for cleaning substrates, which tool and method utilizes a rapidly-flowing fluid to clean organic films and particles from the substrates.

Another object of the present invention is to provide an all-purpose cleaning tool for substrates.

A still further object of the present invention is to provide a cleaning tool which is capable of utilizing a variety of liquids or gases to clean substrates.

SUMMARY OF THE INVENTION

In accordance with these and other objects and advantages, the present invention is directed to a new and improved cleaning tool for cleaning polymer films and particles from substrates and preventing re-deposition of the films and particles on the substrates during the cleaning process. The cleaning tool of the present invention typically comprises a circulation conduit through which is circulated a cleaning liquid or gas. The circulation conduit is disposed in fluid communication with an upstream flow chamber and a downstream cleaning chamber, the cross-sectional area of which cleaning chamber is less than the cross-sectional area of the flow chamber. In use, the cleaning chamber receives a wafer substrate for cleaning of particles or removal of polymer films from the substrate. Accordingly, the smaller cross-sectional area of the cleaning chamber accelerates the flow of a cleaning fluid flowing through the cleaning chamber from the flow chamber. The rapidly-flowing cleaning fluid removes the particles and/or films from the substrate while preventing dropping of the removed particles or re-deposition of the film back onto the substrate. A particle filter is typically provided in the circulation conduit downstream of the cleaning chamber for removing the particles from the circulation conduit.

BRIEF DESCRIPTION OF THE DRAWINGS

The present invention will now be described, by way of example, with reference to the accompanying drawings, in which:

FIG. 1 is a schematic view illustrating a typical conventional batch-type cleaning tool for substrates;

FIG. 2 is a schematic view illustrating a typical conventional spin-type cleaning tool for substrates;

FIG. 3 is a schematic view illustrating an illustrative embodiment of the cleaning tool of the present invention;

FIG. 4 is a side schematic view of an upstream flow chamber and a downstream cleaning chamber of the cleaning tool of the present invention, illustrating a disparity in the rates of fluid flow through the flow chamber and the cleaning chamber; and FIG. 5 is a schematic view illustrating a disparity in cross-sectional areas of the flow chamber and the cleaning chamber.

DESCRIPTION OF THE PREFERRED EMBODIMENTS

When used herein, the term "conduit" shall be construed to mean any vessel or system or combination of vessels capable of conveying a liquid or gaseous fluid, whether as part of a closed circulation loop or an open system. When used herein, the term "cleaning fluid" shall be construed to mean any liquid capable of dissolving and/or removing films, particles and/or other substances from a surface, including but not limited to deionized water or diluted hydrogen fluoride (HF); and/or any gas capable of dissolving and/or removing films, particles and/or other substances from a surface, including but not limited to carbon dioxide, clean dry air, nitrogen, and argon.

The present invention has particularly beneficial utility in the cleaning of polymer films and particles from semiconductor wafer substrates in the semiconductor fabrication industry. However, the invention is not so limited in application, and while references may be made to such semiconductor wafer substrates, the present invention is more generally applicable to removing films and particles from objects in a variety of industrial and mechanical applications.

Referring to FIGS. 3–5, an illustrative embodiment of the cleaning tool of the present invention is generally indicated by reference numeral 16 and may include a continuous circulation conduit 17 typically having a pump 18 for circulating a cleaning fluid (not shown), which may be either a liquid or a gas, through the circulation conduit 17 as hereinafter further described. The circulation conduit 17 typically includes a fluid inlet arm 19 provided in fluid communication with a downstream flow chamber 20 that defines a flow chamber interior 21 having a cross-sectional area "A1", as shown in FIG. 5. A downstream cleaning chamber 22 is provided in fluid communication with the upstream flow chamber 20 and defines a cleaning chamber interior 23 having a cross-sectional area "A2" which is less than the cross-sectional area "A1" of the flow chamber 20, as further shown in FIG. 5. The cleaning chamber 22 may extend from the flow chamber 20 in concentric relationship thereto, as shown in FIG. 4. However, as shown in FIGS. 3 and 5, in a preferred embodiment the cleaning chamber 22 extends from the flow chamber 20 in off-centered relationship thereto. A fluid outlet arm 24 extends from fluid communication with the upstream cleaning chamber 22, and a particle filter 25 may be provided in the fluid outlet arm 24 for purposes hereinafter described. The fluid outlet arm 24 typically re-enters the continuous circulation conduit 17. A wafer support 27 is provided in the cleaning chamber 22 for supporting a wafer substrate 28 during cleaning of films and/or particles from the wafer substrate 28, as hereinafter described. A typical direction of cleaning fluid flow through the cleaning tool 16 is indicated by the arrows in FIG. 3, wherein the cleaning fluid is continually distributed through the circulation conduit 17 and flows through the fluid inlet arm 19, the flow chamber interior 21, the cleaning chamber interior 23 and the fluid outlet arm 24, respectively, and finally, re-enters the circulation conduit 17. However, it is understood that the flow chamber 20 and cleaning chamber 22 may be incorporated in cleaning systems of alternative configuration other than the continuous closed or looped circulation conduit 17 of FIG. 3. In either case, due to the smaller cross-sectional area of the cleaning chamber 22 relative to the cross-sectional area of the flow chamber 20, the cleaning fluid flows through the cleaning chamber 22 at a higher velocity than through the flow chamber 20, as hereinafter further described.

The cross-sectional area of the flow chamber 20 and the flow velocity of cleaning fluid through the flow chamber 20 are related to the cross-sectional area of the cleaning chamber 22 and the flow velocity of cleaning fluid through the cleaning chamber 22 according to the following formula:

$$V_1 A_1 = V_2 A_2,$$

where V1 is the velocity of fluid flowing through the flow chamber 20, A1 is the cross-sectional area of the flow chamber 20, V2 is the velocity of fluid flowing through the cleaning chamber 22, and A2 is the cross-sectional area of the cleaning chamber 22. According to the formula, by decreasing A2, or the cross-sectional area of the cleaning chamber 22, the magnitude of V2, or the velocity of cleaning fluid flowing through the cleaning chamber 22, is increased by the same factor as long as V1 and A1 remain the same. For example, when A1=A2, then V1=V2; by reducing A2 to one-half the magnitude of A1, the magnitude of V2 becomes twice the magnitude of V1 where V1 and A1 remain the same.

Referring again to FIG. 3, in typical application of the cleaning tool 16 of the present invention, a wafer substrate 28 is initially placed on the wafer support 27 inside the cleaning chamber interior 23 for the removal of polymer films, such as dry film photoresist, and/or particles from the surface of the wafer substrate 28 during the fabrication of integrated circuits on the substrate 28. A cleaning liquid or gas (not shown), depending upon the specific requirements for cleaning the substrate 28, is then continually circulated through the circulation conduit 17 typically by operation of the pump 18. It will be appreciated by those skilled in the art that any type of cleaning liquid, including DI (deionized) water or HF (hydrogen fluoride), in non-exclusive particular, or any type of cleaning gas, including carbon dioxide, CDA (clean dry air), nitrogen or argon, in non-exclusive particular, may be used as the cleaning fluid circulated through the cleaning tool 16, depending upon the particular cleaning requirements for the substrate 28. As the cleaning fluid is circulated through the circulation conduit 17, the cleaning fluid first enters the fluid inlet arm 19, and then flows through the flow chamber interior 21 of the flow chamber 20 at a velocity V1. The cleaning fluid exits the flow chamber interior 21 and enters the cleaning chamber interior 23 of the cleaning chamber 22, where the flow rate of the cleaning fluid increases to velocity V2, the magnitude of which depends on the cross-sectional area A2 of the cleaning chamber interior 23 relative to the cross-sectional area A1 of the flow chamber interior 21. In a preferred embodiment, the cross-sectional area A2 of the cleaning chamber interior 23 is half or a smaller proportion of the cross-sectional area A1 of the flow chamber interior 21, in order to attain a velocity V2 of the cleaning fluid in the cleaning chamber 22 which is at least twice the velocity V1 of the cleaning fluid in the flow chamber 20. However, it is understood that the present invention contemplates embodiments wherein the value of A2 is at least slightly smaller, typically at most about 90% of the value of A1.

As it flows through the cleaning chamber interior 23 at the velocity V2, the cleaning fluid dislodges particles from the surface of the substrate 28, and these flow with the cleaning fluid from the cleaning chamber interior 23 into the fluid outlet arm 24. As the cleaning fluid flows through the particle filter 25, the particles in the cleaning fluid become trapped in the particle filter 25. In the case that the cleaning fluid is an organic solvent, the fluid dissolves and removes organic films such as photoresist from the substrate 28. The filtered cleaning fluid, devoid of the particles dislodged from the substrate 28, re-enters the circulation loop 17, wherein the cleaning fluid is typically distributed back to the fluid inlet arm 19 and then through the flow chamber 20, respectively, for another cleaning cycle in the cleaning chamber 22.

It will be appreciated by those skilled in the art that the relatively high flow velocity of the cleaning fluid through the cleaning chamber interior 23 effectively carries particles removed from the substrate 28 away from the cleaning chamber interior 23 and entraps the particles in the particle filter 25. This prevents the particles from falling back onto the surface of the substrate 28 after removal therefrom. In the same manner, the rapidly-flowing cleaning fluid prevents organic films removed from the substrate 28 and dissolved in the cleaning fluid from becoming re-deposited on the substrate 28 by rapidly removing the dissolved organic films from the cleaning chamber interior 23.

While the preferred embodiments of the invention have been described above, it will be recognized and understood that various modifications can be made in the invention and the appended claims are intended to cover all such modifications which may fall within the spirit and scope of the invention.

What is claimed is:

1. A cleaning tool for cleaning a substrate, comprising:
   a conduit for conducting a flowing cleaning fluid;
   a flow chamber in fluid communication with said conduit, said flow chamber having a first cross-sectional area for conducting the flowing cleaning fluid at a first flow velocity;
   a cleaning chamber for containing a substrate, said cleaning chamber extended from the flow chamber and disposed in adjacent downstream fluid communication with said flow chamber, said cleaning chamber having a second cross-sectional area less than said first cross-sectional area to form a cross sectional area difference to form a second flow velocity of said flowing cleaning fluid, said second flow velocity greater relative to said first flow velocity; and,
   a particle filter provided in downstream fluid communication with said cleaning chamber for removing particles from the cleaning fluid, wherein said conduit comprises a continuous circulation conduit.

2. The cleaning tool of claim 1 wherein said second cross-sectional area is at most about 90% of said first cross-sectional area in size.

3. The cleaning tool of claim 1, wherein said second flow velocity is inversely proportional to said cross-sectional area difference.

4. The cleaning tool of claim 1 wherein said second cross-sectional area is at most about 50% of said first cross-sectional area in size.

5. A cleaning tool for cleaning a substrate, comprising:
   a conduit for conducting a cleaning fluid;
   a flow chamber having a first cross-sectional area provided in fluid communication with said conduit for conducting said cleaning fluid at a first velocity;
   a cleaning chamber extended from the flow chamber and disposed in adjacent downstream fluid communication with said flow chamber, said cleaning chamber having a reduced second cross-sectional area compared to said first cross-sectional area to form a second velocity of said cleaning fluid, said second velocity increased inversely proportional to a reduction of said second cross-sectional area;
   a fluid outlet arm provided in downstream fluid communication with said cleaning chamber for conducting said cleaning fluid; and,
   a particle filter provided in said fluid outlet arm for removing particles from said cleaning fluid, wherein said conduit comprises a continuous circulation conduit.

6. The cleaning tool of claim 5 wherein said second cross-sectional area is at most about 90% of said first cross-sectional area in size.

7. The cleaning tool of claim 5 wherein said second cross-sectional area is at most about 50% of said first cross-sectional area in size.

8. A method for avoiding substrate contamination in a substrate cleaning process, comprising the steps of:
   providing a conduit;
   providing a flow chamber having a first cross-sectional area in downstream fluid communication with said conduit;
   providing a cleaning chamber extended from the flow chamber and having a second cross-sectional area less than said first cross-sectional area to form a cross-sectional area difference in adjacent downstream fluid communication with said flow chamber;
   positioning a substrate in said cleaning chamber;

conducting a cleaning fluid through said conduit and through said flow chamber to form a first flow velocity in said flow chamber;

then conducting said cleaning fluid through said cleaning chamber to form a second flow velocity larger that the first flow velocity according to said cross-sectional area difference; and, filtering said cleaning fluid downstream from said cleaning chamber while continuously circulating the cleaning fluid through the conduit.

9. The method of claim 8 wherein said second cross-sectional area is at most about 90% of said first cross-sectional area in size.

10. The method of claim 8 wherein said cleaning fluid comprises a gas.

11. The method of claim 8, wherein said second flow velocity is inversely proportional to said cross-sectional area difference.

12. The method of claim 8, wherein the substrate is a semiconductor process wafer.

13. The method of claim 8, wherein the substrate cleaning process comprises removing a substance selected from the group consisting of particles and polymer films.

14. The method of claim 8, wherein the cleaning fluid comprises a substance selected from the group consisting of deionized water, HF, carbon dioxide, clean air, argon, and nitrogen.

* * * * *